United States Patent [19]
Huang et al.

[11] Patent Number: 5,374,568
[45] Date of Patent: Dec. 20, 1994

[54] METHOD FOR FORMING A BASE LINK IN A BIPOLAR TRANSISTOR

[75] Inventors: Wen-Ling M. Huang, Phoenix; Shrinath Ramaswami, Mesa; Maureen F. Grimaldi, Chandler, all of Ariz.

[73] Assignee: Motorola, Inc., Schaumburg, Ill.

[21] Appl. No.: 125,986

[22] Filed: Sep. 23, 1993

[51] Int. Cl.$^5$ .......................................... H01L 21/265
[52] U.S. Cl. ..................... 437/31; 437/228; 437/917; 437/32; 437/909; 148/DIG. 10
[58] Field of Search ............. 437/31, 32, 59, 228, 437/909, 917; 148/DIG. 9, DIG. 10; 156/653, 657

[56] References Cited

U.S. PATENT DOCUMENTS

| | | | |
|---|---|---|---|
| 4,892,837 | 1/1990 | Kudo | 437/228 |
| 5,204,276 | 4/1993 | Nakajima et al. | 437/31 |

OTHER PUBLICATIONS

Wolf et al., "Sihion Processing for the VLSI Era, vol. 1" pp. 521–529, 547–557.
G. G. Shahidi, "A Novel High-Performance Lateral Bipolar on SOI." IEEE. 1991. pp. 663–666.

Primary Examiner—Tom Thomas
Assistant Examiner—Tuan Nguyen
Attorney, Agent, or Firm—Aaron B. Bernstein

[57] ABSTRACT

A method for forming an improved base link for a bipolar transistor is provided. The wall where the base link (44) is formed is substantially vertical (32,34). An oxide mask (24) is use during etching of the polysilicon layer (18) that provides the wall, instead of a conventional photoresist mask. The preferred method is compatible with manufacturing BiCMOS devices.

11 Claims, 4 Drawing Sheets

METHOD FOR FORMING A BASE LINK IN A BIPOLAR TRANSISTOR

BACKGROUND OF THE INVENTION

The present invention relates, in general, to semiconductor devices, and more particularly, to a method for forming a base link in a bipolar transistor.

Conventional lateral bipolar transistors commonly have a narrow base region in the center of the lateral active area of the device. The base region within the active area is considered the intrinsic base. Additionally, conventional lateral bipolar transistors include an extrinsic base portion which is typically a portion of a doped polysilicon layer above and offset from the intrinsic base region in the underlying active region of the device. The extrinsic base portion is typically coupled to the intrinsic base region with a vertical base link. The base link commonly comprises a vertical polysilicon spacer having composition similar to the extrinsic base portion.

Typically, the shape and orientation of the base link greatly influences the definition of the intrinsic base region. This is because the intrinsic base region within the lateral active area is formed integrally with the forming of the polysilicon spacer base link. Consequently, it is important that the formation of the base link be controllable and accurate so that a consistent base link and intrinsic base can be defined.

The base link is typically formed along a vertical wall defined by well known photolithographic processes. More specifically, the vertical wall is typically etched using a photoresist mask. A problem arises, however, when the bipolar transistors are only a small portion or component of a larger device. This is the case for BiCMOS devices, where the majority of transistors are MOS devices and relatively few are bipolar devices. Under such circumstances, the vast majority of the devices must be covered with photoresist during definition of the vertical wall for the base link.

Due to the chemistry of the photoresist, the high amounts of photoresist inhibit the etching of the vertical wall for the base link. The resulting wall tends to be substantially angled rather than vertical. It is difficult to form an effective base link along this angled wall.

An additional problem which arises in conventional lateral bipolar transistor fabrication relates to the oxide layer which typically separates the polysilicon extrinsic base layer from the lateral active region in the surface of the substrate. This oxide layer must be etched along with the overlying polysilicon layer when defining the wall for the base link. Conventionally, the wall is defined using a timed etch. Unfortunately, timed etches do not take into account potential slight composition differences from wafer to wafer, for example. Consequently, in some cases overetching occurs and a significant amount of the active layer below the oxide layer is removed.

What is needed is an improved process for defining a base link which does not result in a substantially angled wall upon which the base link must be formed. Furthermore, it would be desirable to avoid unwanted removal of the active layer due to overetching of the oxide layer which separates the polysilicon extrinsic base layer from the active layer.

SUMMARY OF THE INVENTION

Briefly stated, the present invention provides a method for forming a base link in a bipolar transistor. Generally, the method includes providing a semiconductor structure comprising an active layer, a first oxide layer above the active layer, and polysilicon layer above the first oxide layer. A second oxide layer is formed above the polysilicon layer. A mask is formed over a portion of the second oxide layer, leaving uncovered an unprotected portion of the second oxide layer. The unprotected portion of the second oxide layer is etched. The mask is removed and the polysilicon layer is etched using the second oxide layer as a mask. Additionally, the second oxide layer and the first oxide layer are etched simultaneously. Further, a base link contacting the active layer is formed.

DETAILED DESCRIPTION OF THE DRAWINGS

According to a preferred method of the present invention, a method is provided which eliminates the need for using a photoresist mask when etching the wall where the base link is to be formed. Elimination of the photoresist results in a much more consistent and controllable etch process. Consequently, walls having wall angles of nearly 90° can be consistently achieved. This provides a significantly improved base link. Additionally, according to the preferred method, the oxide layer which separates the active layer from the overlying polysilicon layer is accurately etched so as to avoid overetching into the active layer.

Figure 1:
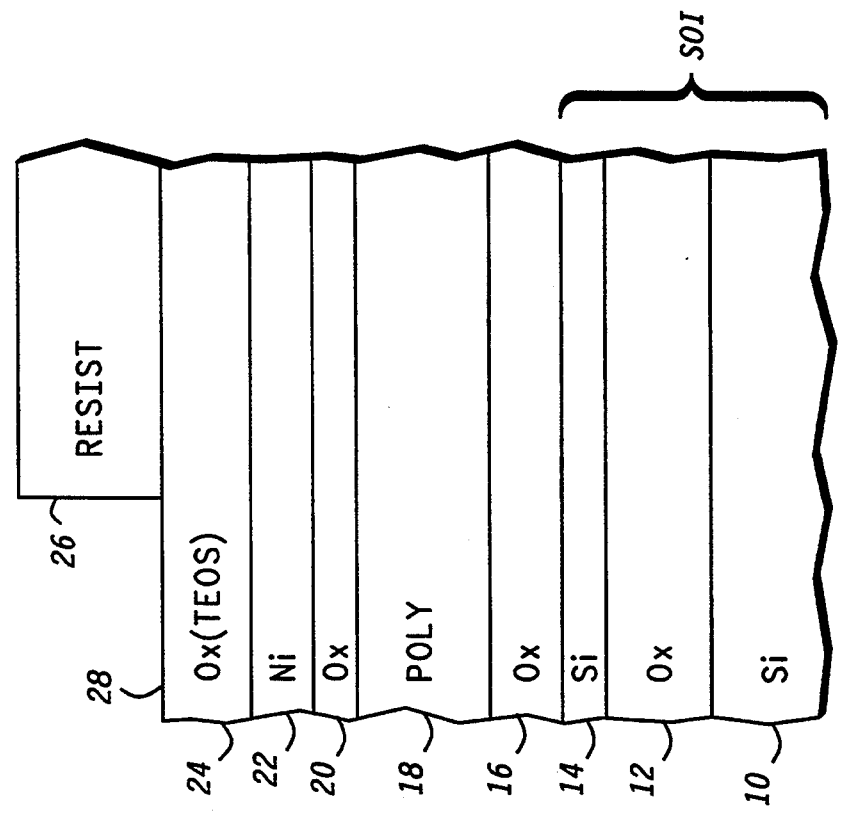
FIG. 1 is a simplified cross-section of a portion of a semiconductor structure where a base link in accordance with the preferred method of the present invention will be formed.

Turning to the figures, FIG. 1 is a partial cross-section of a portion of a semiconductor structure in which a base link will be formed according to the preferred method of the present invention. In this specification, and accompanying claims, the terms "over", "overlying" and the like are used. Those terms are used for convenience, with reference to the figures. One layer is considered overlying a second layer when it appears closer to the top of the figure than the second layer. It should be understood that above, overlying etc. does not necessarily imply direct contact. Furthermore, it should be understood that the present descriptions and claims encompass structures which may be turned sideways, upside-down, etc. In these cases for example, an overlying layer would become a side-by-side layer or an underlying layer, respectively.

Layer 10 of FIG. 1 is a silicon layer composing the bottom of the substrate upon which a BiCMOS device will be formed. The portion of the substrate shown in FIG. 1 is only a small portion of a single bipolar transistor of the BiCMOS device. The portion shown is the portion where the base link will be formed. Methods for fabrication of BiCMOS devices in general are well know in the art. An exemplary method is disclosed in co-pending United States Patent Application, Ser. No. 07/956,224, which is hereby incorporated by reference. Consequently, the novel forming of the base link for the bipolar transistor will be focused on here.

Layer 12 is an oxide layer formed on top of layer 10. Layer 14 is a silicon layer formed above layer 12. Layer 14 composes the active layer in which the lateral bipolar transistor is formed. Layer 14 is preferably approximately 1,000 angstroms thick. Together, layers 10, 12 and 14 compose a silicon on insulator (SOI) substrate forming the basis of the BiCMOS device. Layer 16 is an oxide layer formed above silicon layer 14. Layer 16 is preferably approximately 1,500 angstroms thick.

Polysilicon layer 18 is a polysilicon layer formed over oxide layer 16. The extrinsic base for the bipolar device will be formed in polysilicon layer 18. Polysilicon layer 18 may be interchangeably referred to as the extrinsic base layer. Polysilicon layer 18 is preferably formed with well known LPCVD methods to a thickness of approximately 3,000 angstroms.

Layer 20 is a thin oxide layer which provides a buffer for the subsequent nitride layer to be deposited. Preferably, layer 20 is approximately 120 angstroms thick.

Layer 22 is a protective nitride layer which is required to protect polysilicon layer 18 during subsequent processing. As indicated by FIG. 1, layers 22 and 20 overly polysilicon layer 18. Preferably, protective layer 22 is approximately 1,200 angstroms thick.

Layer 24 is an oxide layer overlying protective layer 22. Preferably, oxide layer 24 comprises tetraethylorthosilicate (TEOS) and has an initial thickness of approximately 1,800 angstroms. During subsequent processing, as explained in more detail below, oxide layer 24 is thinned so that oxide layer 16 is thicker than oxide layer 24 by a predetermined percentage.

Figure 2:
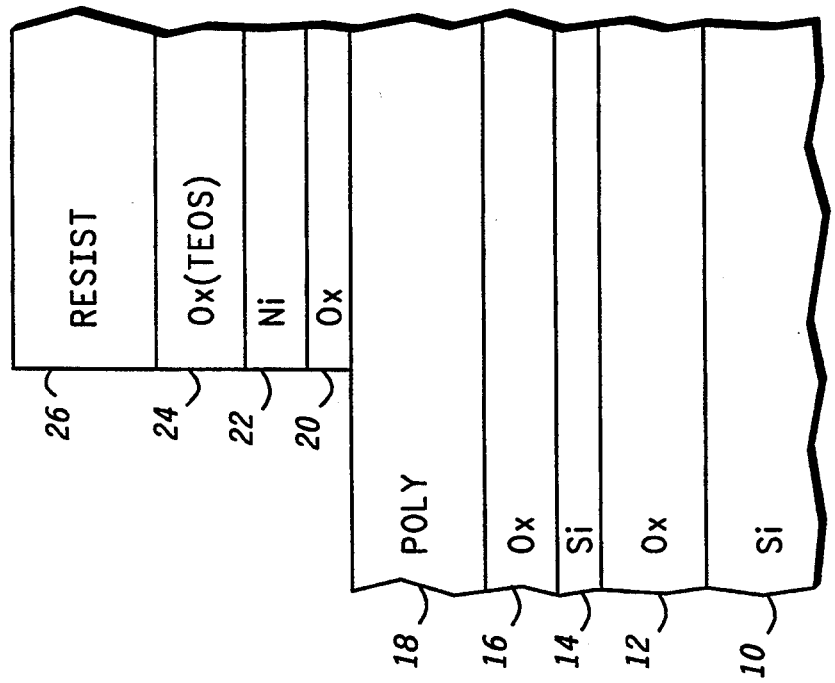
FIG. 2 shows the structure of FIG. 1, in the same view, following the timed etch of the layers overlying the polysilicon layer.

Layer 26 comprises a photoresist mask covering a portion of oxide layer 24. Resist layer 26 is defined so as to leave an unprotected portion 28 of oxide layer FIG. 2 illustrates the structure of FIG. 1 following the timed etch of oxide layer 24, nitride layer 22 and oxide layer 20. The etchant chemistry and etching time are conventional, and are well understood by those skilled in the art. During this etch, unprotected portion 28 shown in FIG. 1 is etched using photoresist layer 26 as a mask.

Figure 3:
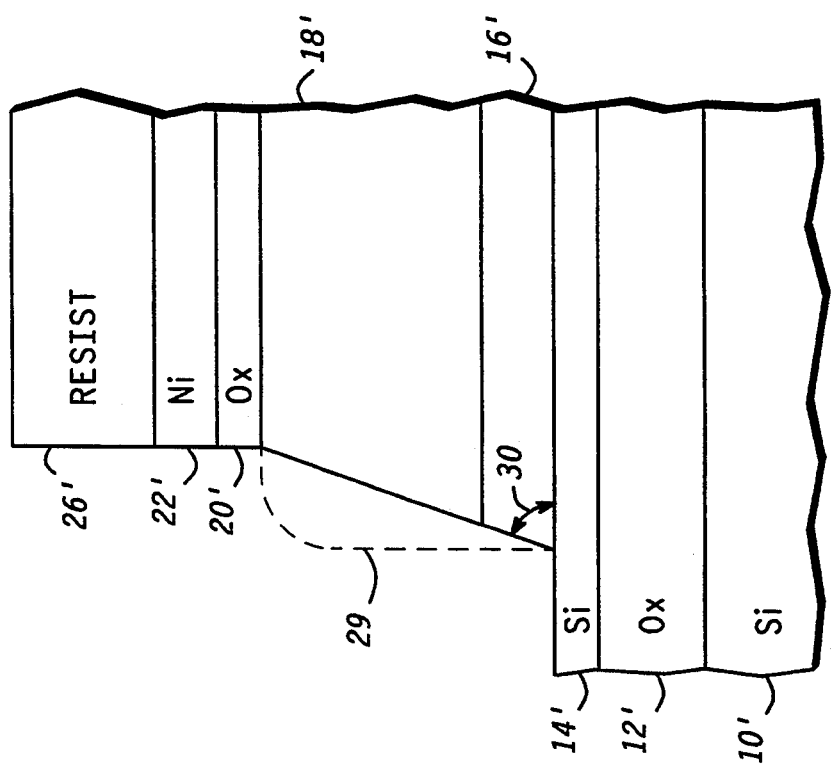
FIG. 3 is a simplified cross-section illustrating the results of a prior art approach to forming the wall for the vertical base link.

The next significant step in the preferred method is to begin forming the wall upon which the base link will be formed. Before the preferred method is discussed in detail, the prior art will be addressed briefly. FIG. 3 illustrates the prior art approach to forming the wall upon which a base link will be formed. The reference numbers of FIG. 3 are primed to indicate analogous layers to those shown in the other FIGs. It should be noted that there is no layer in the prior art analogous to oxide layer 24 of the structure made in accordance with the present invention.

According to the prior art methods, a timed etch is used to etch the entire stack of layers 22′, 20′, 18′ and 16′. This contrasts with the process illustrated by FIG. 2, where the time etch was used only to etch down to the top of polysilicon layer 18. Moreover, according to the prior art method, resist layer 26′ is used as a mask for the entire stack etch, all the way down to active layer 14′. It will be recognized by those skilled in the art that polymers from resist layer 26′ can interfere with the etching of the stack of layers below. In the case where there are very few of the bipolar devices on the surface of the semiconductor device being formed, photoresist layer 26′ will be covering the vast majority of the surface of the semiconductor substrate. Consequently, there will be a great potential for polymers from the photoresist to inhibit the etching of the layers stacked below.

Polymers inhibiting the etching results in the fairly significant edge angle 30, where the etched wall meets active layer 14′. The significant edge angle makes it very difficult to form an effective base link along the etched wall later in the process. This is because the material forming the base link is deposited straight down, and then etched with well known reactive ion etching (RIE) techniques. The shape of spacer that results is indicated by dotted line 29. Such a spacer is severely pinched off at the bottom. As discussed above, the base link affects the later formation of the intrinsic base in the active region below. The pinched off base link makes a poor control for the intrinsic base region, and also makes poor contact to the intrinsic base region. The preferred embodiment of the method of the present invention substantially eliminates the significant edge angle 30, thereby preventing the pinched off base link.

Figure 4:
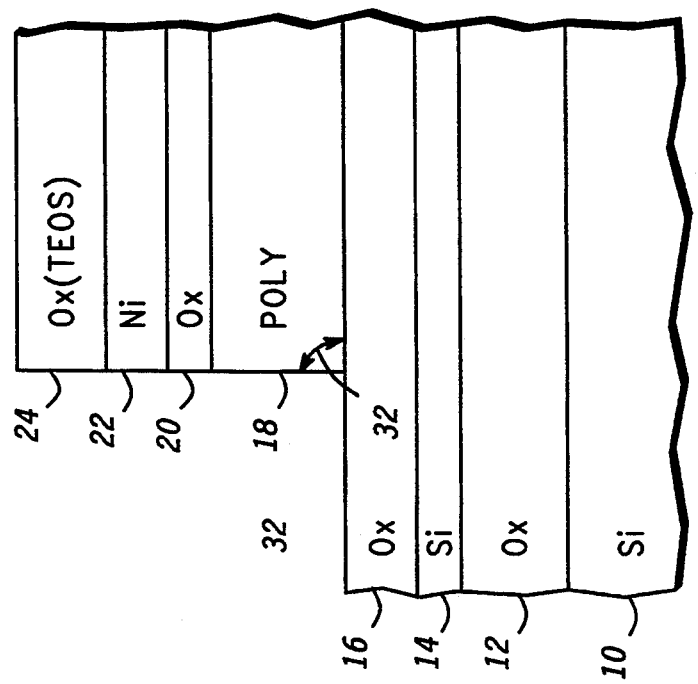
FIG. 4 shows the structure of FIG. 2, in the same view, following the etching of the polysilicon layer.

FIG. 4 illustrates the structure of FIG. 2 following the etching of polysilicon layer 18. An important distinction between the technique illustrated by FIG. 4 and the prior art technique of FIG. 3, is that oxide layer 24 has been used as a mask to etch polysilicon layer 18, rather than photoresist. Prior to etching polysilicon layer 18, photoresist layer 26 is stripped. Consequently, there is no photoresist providing polymers which inhibit the etching of polysilicon layer 18. Therefore, a substantially straight wall is formed rather than an angled wall. According to the preferred method, polysilicon edge angle 32 is greater than 80°, and preferably 90°. The polysilicon edge angle is the angle between the polysilicon edge and the underlying oxide layer 16, in the direction of the remaining polysilicon material of layer 18.

To further improve the etching of polysilicon layer 18, an end point etch is used rather than the conventional timed etch. Instrumentation well known in the art is used to detect the disappearance of the unmasked portion of polysilicon layer 18. The etch is stopped when the disappearance of the polysilicon layer is detected. Consequently, minimal overetching of underlying oxide layer 16 occurs.

FIG. 4 additionally illustrates that the etch step which etches polysilicon layer 18 also partially etches oxide layer 24. More specifically, according to the preferred method, oxide layer 24 has been etched from original thickness of 1,800 angstroms to a thickness of approximately 1,200 angstroms. At this point, oxide layer 16 is twenty-five percent thicker (300 angstroms) than oxide layer 24. This relationship is important in later processing steps.

Figure 5:
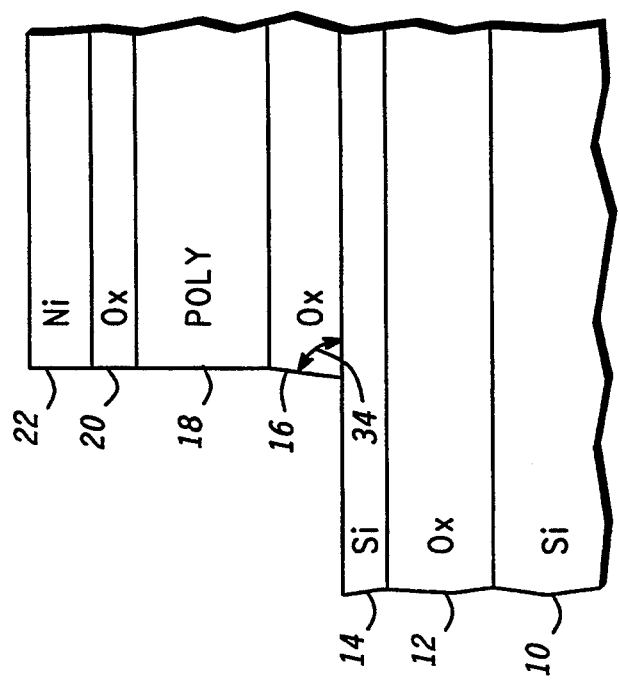
FIG. 5 shows the structure of FIG. 4, in the same view, following the etching of the oxide layer separating the active layer from the polysilicon layer.

FIG. 5 illustrates the structure of FIG. 4 following the etching of oxide layers 24 and 16. According to the preferred method, oxide layer 24 and oxide layer 16 are etched simultaneously with well known etching methods. Additionally, according to the preferred method, an oxide layer etch time is established by detecting the appearance of nitride layer 22. Apparatus and methods for detecting nitride layer 22 are well known in the art.

Once the appearance of nitride layer 22 is detected, oxide layer 16 is further etched for a predetermined percentage of the established oxide etch time. In the preferred embodiment, since oxide layer 16 is twenty-five percent thicker than oxide layer 24, oxide layer 16 is etched for an additional twenty-five percent of the established oxide etch time. This method provides for accurate and controllable etching of oxide layer 16 and prevents undesired removal of silicon from active layer 14, due to overetching.

Like the etching of extrinsic base layer 18, the etching of oxide layer 16 is accomplished without a photoresist mask. Consequently, a good oxide edge angle 34 is established. The oxide edge angle is the angle between the oxide edge and the underlying active layer 14, in the direction of the remaining oxide material of layer 16.

Although a slightly smaller oxide edge angle than 90° will tend to be formed, angle 34 still remains much larger than angle 30 shown in FIG. 3, provided by the methods of the prior art. According to the preferred method, angle 34 is greater than 75°, and preferably 85° Consequently, a substantially straight wall is formed by the preferred method, as distinguished from the highly angled wall provided by the prior art method shown in FIG. 3. The straight wall allows for the formation of a more consistent, controllable and accurate base link.

Figure 6:
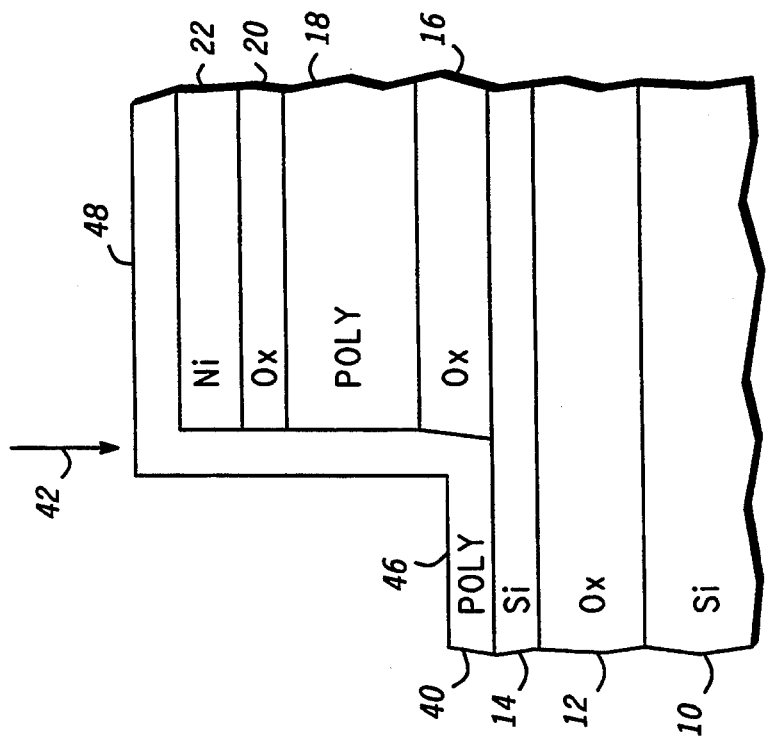
FIG. 6 illustrates the structure of FIG. 5, in the same view, following the deposition of a polysilicon layer.

FIG. 6 illustrates the structure of FIG. 5, following the deposition of a thin polysilicon layer which will form the base link. Polysilicon layer 40 is preferably a 550 angstrom layer deposited according to well known methods. It will be recognized by those skilled in the art that the polysilicon material is deposited in the direction indicated by arrow 42. Accordingly, the vertical wall provided by the preferred method allows for a uniform polysilicon spacer thickness.

Figure 7:
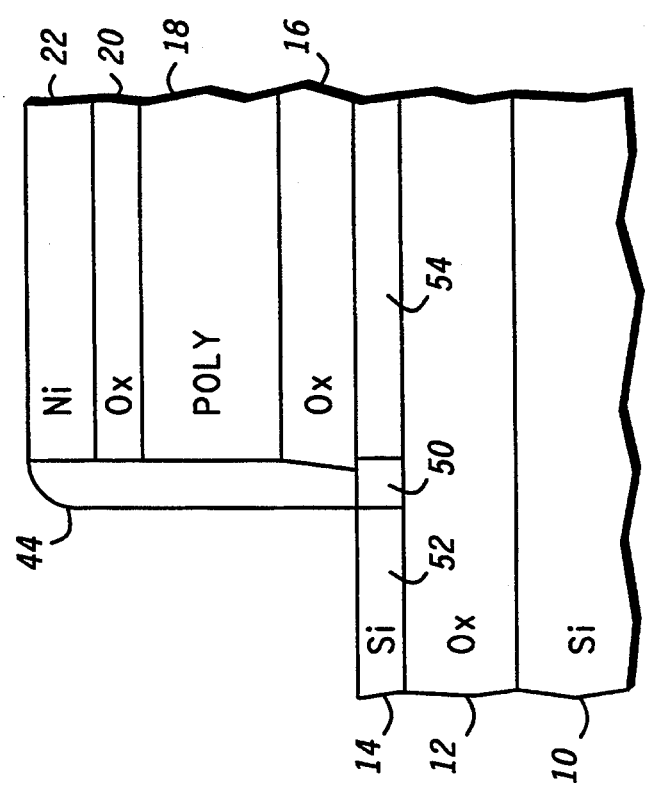
FIG. 7 illustrates the structure shown in FIG. 6, in the same view, following the definition of the vertical base link.

FIG. 7 illustrates the structure of FIG. 6 after the base link 44 has been defined. Base link 44 is preferably defined by well known RIE etching techniques. The etching of polysilicon layer 40 to define base link 44 is stopped when nitride layer 22 is detected. There is no potential for overetching into active layer 14 because bottom portion 46 of polysilicon layer 40 is inherently the exact same thickness as upper portion 48 (FIG. 6).

Intrinsic base region 50 is shown in FIG. 7 below base link 44. Base region 50 is a doped region as is well known in the art. According to the preferred method, base region 50 is doped before the definition of base link 44. It will be understood by those skilled in the art that region 52 of active layer 14 comprises an emitter region and region 54 of active layer 14 comprises a collector region. It will also be recognized that the remainder of processing required to complete the bipolar device incorporating the improved base link can be carried out according to well known methods.

By now it should be appreciated that a method is provided for forming an improved base link for a bipolar transistor. The wall where the base link is formed is substantially vertical. Consequently, an accurate, controllable and effective base link is produced.

We claim:

1. A method for forming a base link in a bipolar transistor comprising the steps of:
   providing a semiconductor structure comprising an active layer, a first oxide layer above the active layer and a polysilicon layer above the first oxide layer;
   forming a second oxide layer above the polysilicon layer;
   forming a mask over a portion of the second oxide layer to provide an unprotected portion of the second oxide layer;
   etching the unprotected portion of the second oxide layer;
   removing the mask;
   etching the polysilicon layer using the second oxide layer as a mask;
   etching the second oxide layer and the first oxide layer simultaneously; and
   forming a base link contacting active layer.

2. The method of claim 1, wherein the step of etching the polysilicon layer comprises detecting disappearance of the polysilicon layer.

3. The method of claim 1, further comprising the step of forming a nitride layer between the polysilicon layer add the second oxide layer.

4. The method of claim 3, wherein the step of etching the second oxide layer and the first oxide layer simultaneously comprises detecting appearance of the nitride layer.

5. The method of claim 3, wherein the step of forming the second oxide layer comprises forming the second oxide layer thinner than the first oxide layer such that the first oxide layer is thicker than the second oxide layer by a known percentage, and wherein the step of etching the second oxide layer and the first oxide layer simultaneously comprises detecting appearance of the nitride layer to establish a second oxide layer etch time, and continuing to etch the first oxide layer by the known percentage of the second oxide layer etch time.

6. The method of claim 3, wherein the step of forming the base link comprises etching a polysilicon layer and detecting the appearance of the nitride layer.

7. The method of claim 1, wherein the step of forming the second oxide layer comprises forming a layer of TEOS.

8. A method for forming a base link in a bipolar transistor comprising the steps of:
   providing a semiconductor structure comprising a first oxide layer overlying a protective layer overlying a polysilicon layer overlying a second oxide layer overlying an active layer, wherein the second oxide layer is a known percentage thicker than the first oxide layer;
   etching the polysilicon layer using the first oxide layer as a mask;
   etching the second oxide layer and the first oxide layer simultaneously;
   determining a first oxide layer etch time by detecting appearance of the protective layer;
   further etching the second oxide layer for an amount of time which is the known percentage of the first oxide layer etch time; and
   forming a polysilicon base link contacting the active layer.

9. The method of claim 8, wherein the step of etching the polysilicon layer comprises producing a polysilicon layer edge angle of greater than 80° but less than or equal to 90°.

10. The method of claim 8, wherein the step of etching the second oxide layer and the first oxide layer simultaneously comprises providing a second oxide layer edge angle of greater than 75° but less than or equal to 90°.

11. The method of claim 8, wherein the step of etching the polysilicon layer comprises detecting disappearance of the polysilicon layer.

* * * * *

UNITED STATES PATENT AND TRADEMARK OFFICE
CERTIFICATE OF CORRECTION

PATENT NO. : 5,374,568
DATED : December 20, 1994
INVENTOR(S) : HUANG ET AL.

It is certified that error appears in the above-indentified patent and that said Letters Patent is hereby corrected as shown below:

Column 6, claim 3, line 25, delete "add" and insert therefor --and--.

Signed and Sealed this

Twenty-first Day of November, 1995

Attest:

BRUCE LEHMAN

Attesting Officer

Commissioner of Patents and Trademarks